United States Patent
Tryon et al.

(10) Patent No.: US 11,719,865 B2
(45) Date of Patent: Aug. 8, 2023

(54) VISIBLE-LIGHT-REFLECTING COATINGS FOR ELECTRONIC DEVICES

(71) Applicant: Apple Inc., Cupertino, CA (US)

(72) Inventors: Brian S. Tryon, Redwood City, CA (US); Lijie Bao, Saratoga, CA (US); Martin Melcher, Mountain View, CA (US); Sonja R. Postak, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 240 days.

(21) Appl. No.: 17/176,992

(22) Filed: Feb. 16, 2021

(65) Prior Publication Data

US 2021/0286112 A1    Sep. 16, 2021

Related U.S. Application Data

(60) Provisional application No. 62/988,346, filed on Mar. 11, 2020.

(51) Int. Cl.
*G02B 5/08* (2006.01)
*G02B 5/28* (2006.01)

(52) U.S. Cl.
CPC ........... *G02B 5/0833* (2013.01); *G02B 5/286* (2013.01)

(58) Field of Classification Search
CPC ............. G02B 5/286; G02B 5/00–5/32; C23D 14/0641; C23D 14/0635; C23D 14/0664;
(Continued)

(56) References Cited

U.S. PATENT DOCUMENTS

| 6,030,695 A | 2/2000 | Ohkubo et al. |
| 8,696,879 B2 | 4/2014 | Myli et al. |

(Continued)

FOREIGN PATENT DOCUMENTS

| CN | 101374976 A | 2/2009 |
| CN | 101970720 A | 2/2011 |

(Continued)

OTHER PUBLICATIONS

Wang et al., Comparison of crack resistance between ternary CrSiC and quaternary CrSiCN coatings via nanoindentation, Materials Science & Engineering A 642, 2015, pp. 391-397.

(Continued)

*Primary Examiner* — Prashant J Khatri
(74) *Attorney, Agent, or Firm* — Treyz Law Group, P.C.; Michael H. Lyons; David K. Cole

(57) ABSTRACT

An electronic device may include conductive structures having a visible-light-reflecting coating. The coating may include a seed layer, transition layers, a neutral-color base layer, and an uppermost layer that forms a single-layer interference film. The neutral-color base layer may be opaque to visible light. The interference film may include silicon and may have an absorption coefficient between 0 and 1. The interference film may include, for example, CrSiCN or CrSiC. The composition of the interference film, the thickness of the interference film, and/or the composition of the base layer may be selected to provide the coating with a desired color in the visible spectrum (e.g., at blue or purple wavelengths). The color may be relatively stable even if the thickness of the coating varies across its area.

24 Claims, 10 Drawing Sheets

(58) Field of Classification Search
CPC ............ C23D 14/0688; C23D 14/0015; C23D 14/024; H04M 1/0283
See application file for complete search history.

(56) References Cited

U.S. PATENT DOCUMENTS

| | | |
|---|---|---|
| 9,905,633 B1 | 2/2018 | Yang |
| 9,968,980 B2 | 5/2018 | Sobiech et al. |
| 10,239,279 B2 | 3/2019 | Koike et al. |
| 10,510,736 B2 | 12/2019 | Higginson et al. |
| 2008/0014420 A1* | 1/2008 | Chan .................. C23C 14/0664 204/192.1 |
| 2012/0013976 A1 | 1/2012 | Weber |
| 2014/0044944 A1* | 2/2014 | Cha .................... C23C 14/0641 428/697 |
| 2014/0099489 A1* | 4/2014 | Cha .................... C23C 14/0641 428/446 |
| 2014/0287214 A1* | 9/2014 | Cha .................... C23C 14/0676 204/192.15 |
| 2018/0334741 A1 | 11/2018 | Sukadhare et al. |
| 2020/0032387 A1 | 1/2020 | Schuster et al. |
| 2020/0071838 A1 | 3/2020 | Tryon et al. |

FOREIGN PATENT DOCUMENTS

| | | | |
|---|---|---|---|
| CN | 103895279 A | 7/2014 | |
| CN | 103935076 A | 7/2014 | |
| CN | 105568231 A | 5/2016 | |
| CN | 108425089 A | 8/2018 | |
| CN | 110484867 A * | 11/2019 | ......... C23C 14/0015 |
| CN | 110876245 A | 3/2020 | |
| CN | 112394439 A | 2/2021 | |
| DE | 102016218028 A1 | 3/2018 | |
| EP | 3778990 A1 | 2/2021 | |
| WO | 2008007165 A1 | 1/2008 | |

OTHER PUBLICATIONS

U.S. Appl. No. 16/932,621, filed Jul. 17, 2020.

* cited by examiner

VISIBLE-LIGHT-REFLECTING COATINGS FOR ELECTRONIC DEVICES

This application claims the benefit of U.S. Provisional Patent Application No. 62/988,346, filed Mar. 11, 2020, which is hereby incorporated by reference herein in its entirety.

FIELD

This relates generally to coatings for electronic device structures and, more particularly, to visible-light-reflecting coatings for conductive electronic device structures.

BACKGROUND

Electronic devices such as cellular telephones, computers, watches, and other devices contain conductive structures such as conductive housing structures. The conductive structures are provided with a coating that reflects particular wavelengths of light so that the conductive components exhibit a desired visible color.

It can be difficult to provide coatings with a relatively uniform thickness, particularly on conductive structures with non-planar shapes. If care is not taken, thickness variations in the coating can undesirably distort the color and visual appearance of the coating across its area.

SUMMARY

An electronic device may include conductive structures such as conductive housing structures. The conductive structures may have three-dimensional surfaces or other non-planar shapes. A visible-light-reflecting coating may be formed on the conductive structures. The coating may include a seed layer on the conductive structures, one or more transition layers on the seed layer, a neutral-color base layer on the transition layers, and a single-layer interference film on the neutral-color base layer. The single-layer interference film may be the uppermost layer of the coating. The neutral-color base layer may be opaque to visible light.

The single-layer interference film may include silicon and may have an absorption coefficient between 0 and 1. The single-layer interference film may include, for example, CrSiCN or CrSiC. The neutral-color base layer may include, for example, CrSiN. The composition and thickness of the single-layer interference film may be selected to provide the coating with a desired color (e.g., blue or purple in scenarios where CrSiC is used or blue in scenarios where CrSiCN is used). Light reflected by the interfaces of the single-layer interference film may constructively and destructively interfere to exhibit a relatively uniform reflected intensity across a wavelength in the visible spectrum (e.g., at blue or purple wavelengths). This may configure the coating to exhibit a relatively uniform (stable) color near the middle of the visible spectrum even if the thickness of the coating varies across its area. In another suitable arrangement, the single-layer interference film and the neutral-color base layer may be replaced by a TiSiN color layer.

DETAILED DESCRIPTION

Electronic devices and other items may be provided with conductive structures. Coatings may be formed on the conductive structures to reflect particular wavelengths of visible light so that the conductive structures exhibit a desired color. A visible-light-reflecting coating may be deposited on a conductive substrate. The visible-light reflecting coating may include transition and adhesion layers on the substrate, a neutral-color base layer on the transition and adhesion layers, and an upper-most single-layer interference film on the neutral-color base layer. In other suitable arrangements, the coating may include a non-neutral (colored) base layer instead of a neutral-color base layer and/or a multi-layer thin-film interference filter on the base layer instead of a single-layer interference film.

The single-layer interference film may have a thickness and a composition that configures the coating to reflect light of a particular color within a desired range of the visible light spectrum (e.g., a blue or purple color). The single-layer interference film may include chromium silicon carbonitride or chromium silicon carbide, for example. The composition and thickness of the single-layer interference film may be selected to provide the coating with a non-zero absorption coefficient at some wavelengths to help tune the reflected color of the coating.

The single-layer interference film and the neutral-color base layer may be relatively color-insensitive to variations in thickness of the coating. For example, even if the coating exhibits different thicknesses across its area (e.g., due to limitations in the deposition equipment used to deposit the coating and/or in scenarios where the substrate has a three-dimensional shape), the reflected intensity of the coating may be relatively uniform (e.g., without significant local minima or maxima) across the wavelength band that gives the color of the coating. This may allow the coating and thus the underlying substrate to exhibit a uniform color and aesthetic appearance, even if the substrate is three dimensional and even if the deposition equipment used to deposit the coating is incapable of providing the coating with a precise thickness across its area. The neutral-color base layer and the single-layer interference film may be replaced by a color layer if desired. In these arrangements, the color layer may include titanium silicon nitride, as an example.

Figure 1:
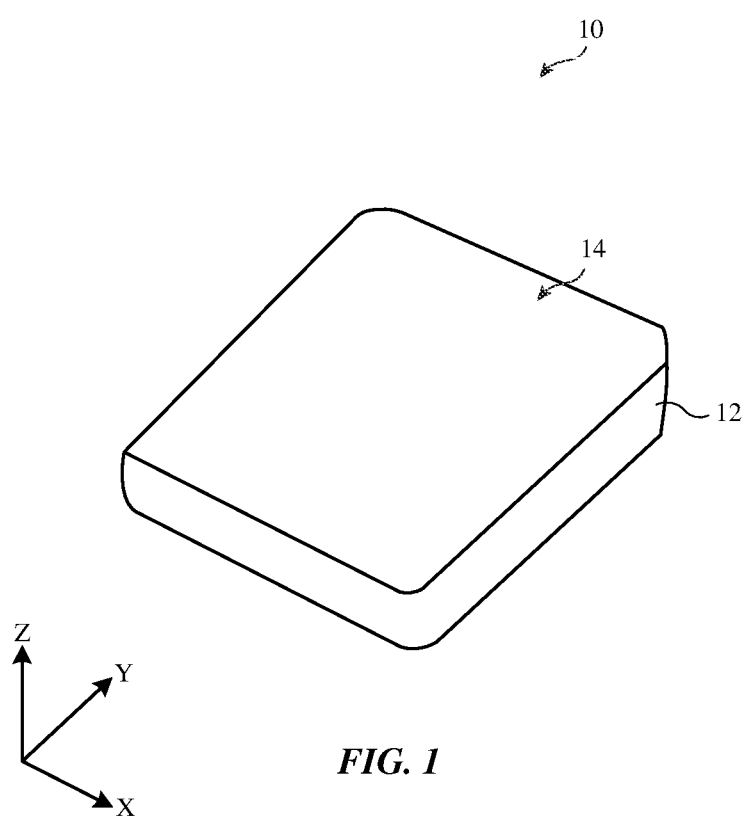
FIG. 1 is a perspective view of an illustrative electronic device of the type that may be provided with conductive structures and visible-light-reflecting coatings in accordance with some embodiments.

An illustrative electronic device of the type that may be provided with conductive structures and visible-light-reflecting coatings is shown in FIG. 1. Electronic device 10 of FIG. 1 may be a computing device such as a laptop computer, a computer monitor containing an embedded computer, a tablet computer, a cellular telephone, a media player, or other handheld or portable electronic device, a smaller device such as a wristwatch device (e.g., a watch with a wrist strap), a pendant device, a headphone or earpiece device, a device embedded in eyeglasses or other equipment worn on a user's head (e.g., a head mounted device), or other wearable or miniature device, a television, a computer display that does not contain an embedded computer, a gaming device, a navigation device, an embedded system such as a system in which electronic equipment with a display is mounted in a kiosk or automobile, a wireless base station, a home entertainment system, a wireless speaker device, a wireless access point, equipment that implements the functionality of two or more of these devices, or other electronic equipment. In the illustrative configuration of FIG. 1, device 10 is a portable device having a substantially rectangular lateral outline such as a cellular telephone or tablet computer. Other configurations may be used for device 10 if desired. The example of FIG. 1 is merely illustrative.

In the example of FIG. 1, device 10 includes a display such as display 14. Display 14 may be mounted in a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Housing 12 may have metal sidewalls or sidewalls formed from other materials. Examples of metal materials that may be used for forming housing 12 include stainless steel, aluminum, silver, gold, titanium, metal alloys, or any other desired conductive material.

Display 14 may be formed at (e.g., mounted on) the front side (face) of device 10. Housing 12 may have a rear housing wall on the rear side (face) of device 10 that opposes the front face of device 10. Conductive housing sidewalls in housing 12 may surround the periphery of device 10. The rear housing wall of housing 12 may be formed from conductive materials and/or dielectric materials.

The rear housing wall of housing 12 and/or display 14 may extend across some or all of the length (e.g., parallel to the X-axis of FIG. 1) and width (e.g., parallel to the Y-axis) of device 10. Conductive sidewalls of housing 12 may extend across some or all of the height of device 10 (e.g., parallel to Z-axis).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of display pixels formed from liquid crystal display (LCD) components, an array of electrophoretic display pixels, an array of plasma display pixels, an array of organic light-emitting diode (OLED) display pixels, an array of electrowetting display pixels, or display pixels based on other display technologies.

Display 14 may be protected using a display cover layer. The display cover layer may be formed from a transparent material such as glass, plastic, sapphire or other crystalline dielectric materials, ceramic, or other clear materials. The display cover layer may extend across substantially all of the length and width of device 10, for example.

Device 10 may include one or more buttons. The buttons may be formed from a conductive button member that is located within (e.g., protruding through) openings in housing 12 or openings in display 14 (as examples). Buttons may be rotary buttons, sliding buttons, buttons that are actuated by pressing on a movable button member, etc.

Figure 2:
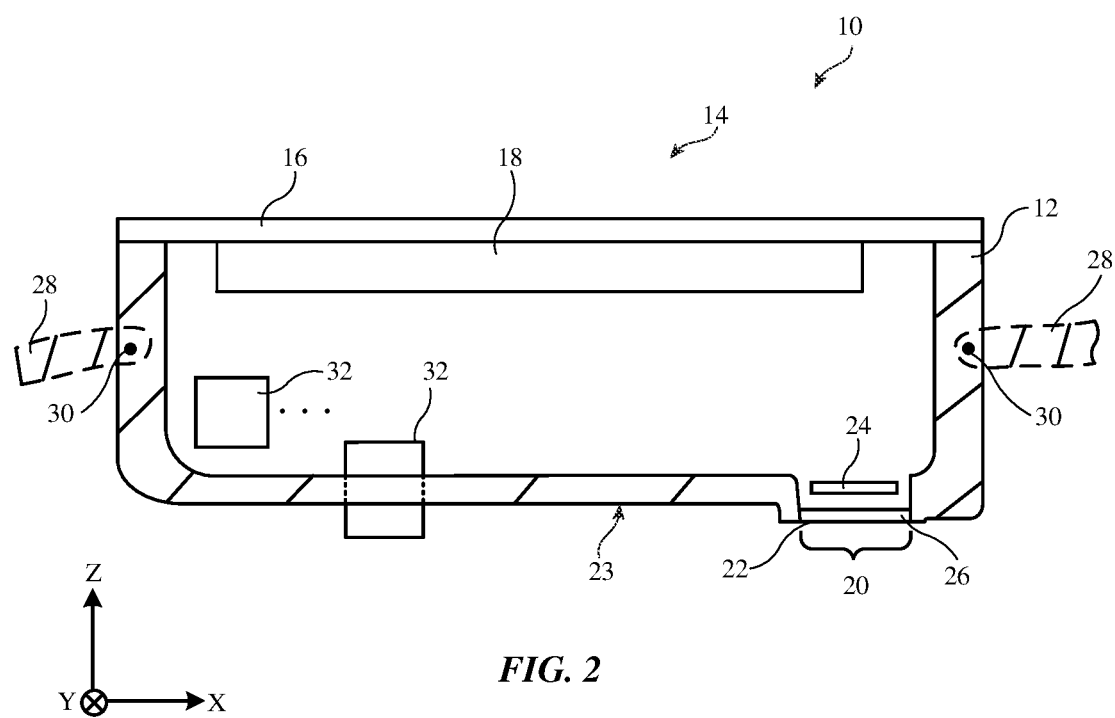
FIG. 2 is cross-sectional side view of an illustrative electronic device having conductive structures that may be provided with visible-light-reflecting coatings in accordance with some embodiments.

A cross-sectional side view of device 10 in an illustrative configuration in which display 14 has a display cover layer is shown in FIG. 2. As shown in FIG. 2, display 14 may have one or more display layers that form pixel array 18. During operation, pixel array 18 forms images for a user in an active area of display 14. Display 14 may also have inactive areas (e.g., areas along the border of pixel array 18) that are free of pixels and that do not produce images. Display cover layer 16 of FIG. 2 overlaps pixel array 18 in the active area and overlaps electrical components in device 10.

Display cover layer 16 may be formed from a transparent material such as glass, plastic, ceramic, or crystalline materials such as sapphire. Illustrative configurations in which a display cover layer and other transparent members in device 10 (e.g., windows for cameras and other light-based devices that are formed in openings in housing 12) are formed from a hard transparent crystalline material such as sapphire (sometimes referred to as corundum or crystalline aluminum oxide) may sometimes be described herein as an example. Sapphire makes a satisfactory material for display cover layers and windows due to its hardness (9 Mohs). In general, however, these transparent members may be formed from any suitable material.

Display cover layer 16 for display 14 may be planar or curved and may have a rectangular outline, a circular outline, or outlines of other shapes. If desired, openings may be formed in the display cover layer. For example, an opening may be formed in the display cover layer to accommodate a button, a speaker port, or other component. Openings may be formed in housing 12 to form communications or data ports (e.g., an audio jack port, a digital data port, a port for a subscriber identity module (SIM) card, etc.), to form openings for buttons, or to form audio ports (e.g., openings for speakers and/or microphones).

Device 10 may, if desired, be coupled to a strap such as strap 28 (e.g., in scenarios where device 10 is a wristwatch device). Strap 28 may be used to hold device 10 against a user's wrist (as an example). Strap 28 may sometimes be referred to herein as wrist strap 28. In the example of FIG. 2, wrist strap 28 is connected to attachment structures 30 in housing 12 at opposing sides of device 10. Attachment structures 30 may include lugs, pins, springs, clips, brackets, and/or other attachment mechanisms that configure housing 12 to receive wrist strap 28. Configurations that do not include straps may also be used for device 10.

Figure 3:
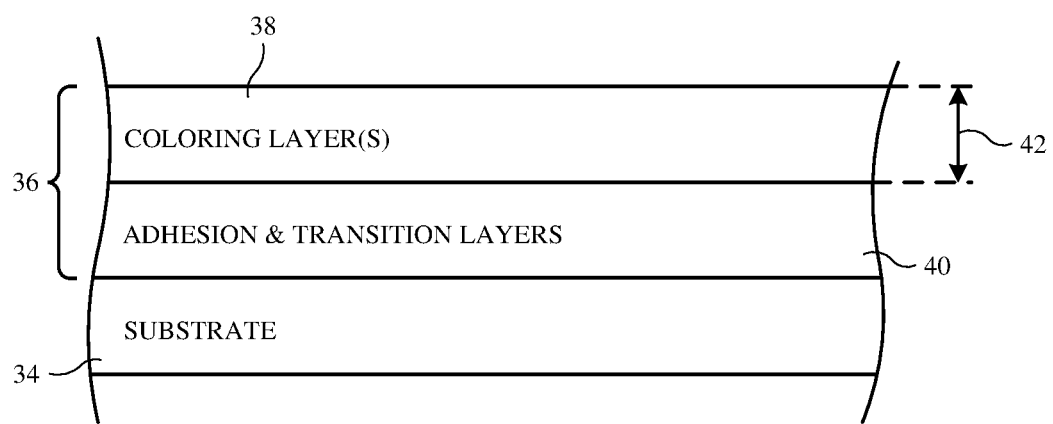
FIG. 3 is a cross-sectional side view of an illustrative visible-light-reflecting coating having a coloring layer that is highly sensitive to thickness variations in accordance with some embodiments.

If desired, light-based components such as light-based components 24 may be mounted in alignment with an opening 20 in housing 12. Opening 20 may be circular, may be rectangular, may have an oval shape, may have a triangular shape, may have other shapes with straight and/or curved edges, or may have other suitable shapes (outlines when viewed from above). Window member 26 may be mounted in window opening 20 of housing 12 so that window member 26 overlaps component 18. A gasket, bezel, adhesive, screws, or other fastening mechanisms may be used in attaching window member 26 to housing 12. Surface 22 of window member 26 may lie flush with exterior surface 23 of housing 12, may be recessed below exterior surface 23, or may, as shown in FIG. 3, be proud of exterior surface 23 (e.g., surface 22 may lie in a plane that protrudes away from surface 23 in the −Z direction). In other words, window member 26 may be mounted to a protruding portion of housing 12. Surface 23 may, for example, form the rear face of housing 12.

Conductive structures in device 10 may be provided with a visible-light-reflecting coating that reflects certain wavelengths of light so that the conductive structures exhibit a desired aesthetic appearance (e.g., a desired color, reflectivity, etc.). The conductive structures in device 10 may include, for example, conductive portions of housing 12 (e.g., conductive sidewalls for device 10, a conductive rear wall for device 10, a protruding portion of housing 12 used to mount window member 26, etc.), attachment structures 30, conductive portions of wrist strap 28, a conductive mesh, conductive components 32, and/or any other desired conductive structures on device 10. Conductive components 32 may include internal components (e.g., internal housing members, a conductive frame, a conductive chassis, a conductive support plate, conductive brackets, conductive clips, conductive springs, input-output components or devices, etc.), components that lie both at the interior and exterior of device 10 (e.g., a conductive SIM card tray or SIM card port, a data port, a microphone port, a speaker port, a conductive button member, etc.), or components that are mounted at the exterior of device 10 (e.g., conductive portions of strap 28 such as a clasp for strap 28), and/or any other desired conductive structures on device 10.

FIG. 3 is a cross-sectional diagram of a visible-light-reflecting coating that may be provided on conductive structures in device 10 (e.g., portions of housing 12 of FIGS. 1 and 2, conductive components 32 of FIG. 2, etc.). As shown in FIG. 3, visible-light-reflecting coating 36 may be formed on substrate 34. Substrate 34 may be a conductive structure in device 10 such as a conductive portion of housing 12 (FIGS. 1 and 2) or a conductive component 32 (FIG. 2). Substrate 34 may be thicker than coating 36. The thickness of substrate 34 may be 0.1 mm to 5 mm, more than 0.3 mm, more than 0.5 mm, between 5 mm and 20 mm, less than 5 mm, less than 2 mm, less than 1.5 mm, or less than 1 mm (as examples). Substrate 34 may include stainless steel, aluminum, titanium, or other metals or alloys.

Coating 36 may include adhesion and transition layers 40 on substrate 34 and one or more uppermost (top) coloring layer(s) 38 on adhesion and transition layers 40. The composition of coloring layer(s) 38 may configure coating 36 to absorb and reflect light at selected wavelengths to impart coating 36 and thus substrate 34 with a desired color and reflectivity.

Coloring layer(s) 38 may, for example, include an intrinsically-colored layer that preferentially absorbs light at particularly wavelengths to reveal the color of the reflected wavelengths to an observer. As an example, coloring layer(s) 38 may include metal nitride, carbide, or carbonitride that provide coating 36 with an intrinsic color (e.g., a titanium silicon nitride color layer). These types of intrinsically-colored layers may exhibit a limited range of possible colors, thereby limiting the aesthetic characteristics of device 10.

In another suitable arrangement, coloring layer(s) 38 may include a thin film interference filter having multiple alternating layers of high and low refractive index materials. Light may reflect off of the interfaces between the layers of the thin film interference filter and the reflected light may constructively and destructively interfere at certain wavelengths to produce reflected light of a particular color and reflectivity for an observer. As an example, the thin film interference filter may include layers of silicon nitride, titanium nitride, zirconium oxide, tantalum oxide, niobium oxide, silicon oxide, aluminum oxide, etc.

In practice, it can be difficult to deposit coloring layer(s) 38 as a thin film interference filter with a relatively uniform thickness 42 across the entire layer. Providing coloring layer(s) 38 with a uniform thickness 42 is particularly difficult when substrate 34 has a three-dimensional geometry instead of a planar geometry (e.g., when the coating is deposited on a three-dimensional conductive structure such as an edge or curved portion of housing 12 of FIGS. 1 and 2, attachment structures 30 of FIG. 2, a three-dimensional conductive component 32 of FIG. 2 such as a conductive button member, a conductive portion of strap 28, an audio port for device 10, a data port for device 10, a SIM card tray for device 10, etc.).

The reflected color exhibited by these types of thin film interference filters may be highly sensitive to thickness variations across the coating. In general, the thickness 42 of coloring layer(s) 38 may determine the reflective characteristics and thus the perceived visible color of coating 36. Small variations in thickness 42 across the lateral area of coloring layer(s) 38 can change the local reflectivity of the coating as a function of wavelength, providing the coating and thus substrate 34 with an unattractive, non-uniform color that varies across its area. Coating 36 may be particularly sensitive to these variations when it is desired to provide coating 36 and substrate 34 with a color near the middle of the visible light spectrum.

Manufacturing limitations associated with the deposition of coating 36 may cause the coating to exhibit different thicknesses across its area, particularly when substrate 34 is a three-dimensional substrate rather than a planar substrate. This may impart coating 36 with the desired color (e.g., a blue color, a purple color, or other desired colors) in some regions of the coating while imparting coating 36 with other undesired colors (e.g., red-shifted or blue-shifted colors) in other regions. This may cause substrate 34 and thus device 10 to exhibit an unattractive aesthetic appearance. It may therefore be desirable to be able to provide substrate 34 with a coating that imparts the substrate with a desired color (e.g., with a blue color, a purple color, or other desired colors), while also exhibiting a reflective response that is relatively insensitive to thickness variations associated with the process for depositing the coating on the substrate.

Figure 4:
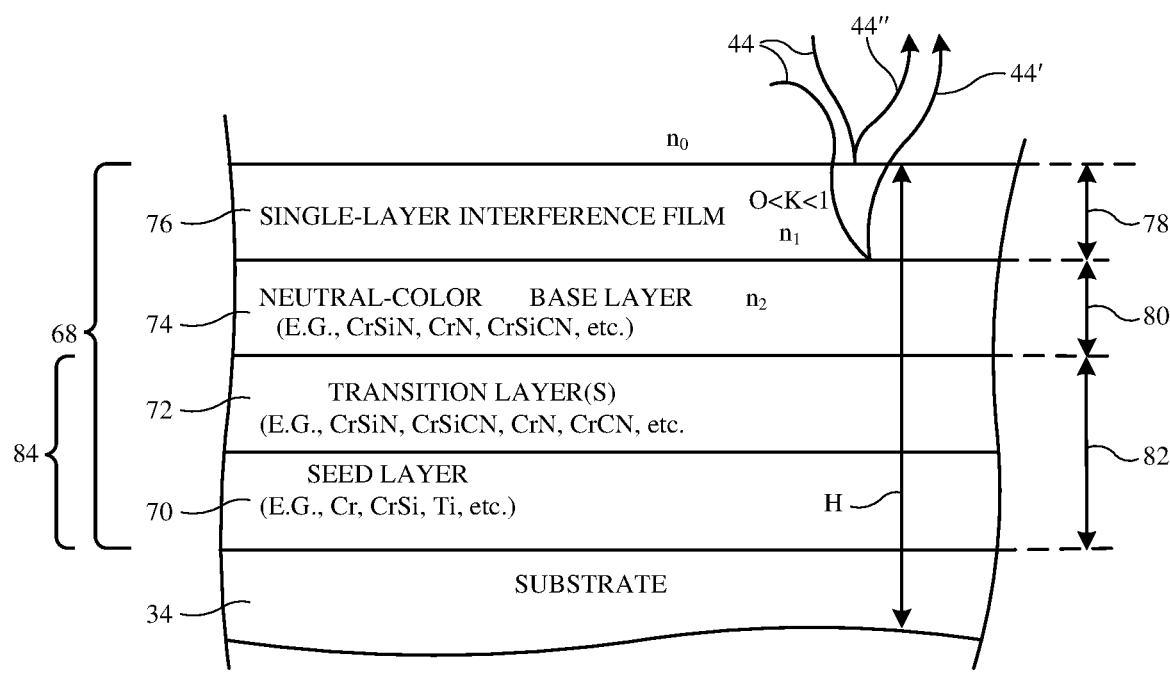
FIG. 4 is a cross-sectional side view of an illustrative coating that reflects visible light with a relatively uniform reflected intensity regardless of thickness variations in accordance with some embodiments.

FIG. 4 is a cross-sectional side view of an illustrative visible-light-reflecting coating that may impart substrate 34 with a desired color while also exhibiting a reflective response that is relatively insensitive to thickness variations. As shown in FIG. 4, a coating such as coating 68 may be layered on substrate 34.

The layers of coating 68 may be deposited on substrate 34 using any suitable deposition techniques. Examples of techniques that may be used for depositing the layers in coating 68 include physical vapor deposition (e.g., evaporation and/or sputtering), cathodic arc deposition, chemical vapor deposition, ion plating, laser ablation, etc. For example, coating 68 may be deposited on substrate 34 in a deposition system having deposition equipment (e.g., a cathode). Substrate 34 may be moved (e.g., rotated) within the deposition system while the deposition equipment (e.g., the cathode) deposits the layers of coating 68. If desired, substrate 34 may be moved/rotated dynamically with respect to speed and/or orientation relative to the deposition equipment (e.g., the cathode) during deposition. This may help provide coating 68 with as uniform a thickness as possible across its area, even in scenarios where substrate 34 has a three-dimensional shape.

As shown in FIG. 4, coating 68 may include a seed layer such as seed layer 70 and one or more transition layers such as transition layer(s) 72. Seed layer 70 may couple substrate 34 to the remaining transition layer(s) 72. Seed layer 70 may include chromium (Cr), chromium silicon (CrSi), titanium (Ti), other metals, metal alloys, and/or other materials. Transition layers 72 may include one or more chromium silicon nitride (CrSiN) layers, chromium silicon carbonitride (CrSiCN) layers, chromium silicon carbide (CrSiC) layers, chromium nitride (CrN) layers, chromium carbonitride (CrCN) layers, and/or any other desired transition layers.

Seed layer 70 and transition layer(s) 72 may sometimes be referred to collectively herein as adhesion and transition layers 84. Adhesion and transition layers 84 may have a thickness 82. Thickness 82 may, for example, be greater than or equal to 0.1 microns, 0.5 microns, 1 micron, 2 microns, 3 microns, or any other desired thickness (e.g., thickness 82 may be between 0.1 and 4 microns, between 0.5 and 3 microns, etc.).

Coating 68 may include a base layer such as neutral-color base layer 74 on adhesion and transition layers 84 (e.g., transition and adhesion layers 74 may couple neutral-color base layer 74 to substrate 34). Neutral-color base layer 74 may exhibit a relatively neutral color (e.g., a relatively uniform reflectivity across the visible spectrum) and may be optically opaque.

For example, neutral-color base layer 74 may exhibit a lightness value (e.g., an L* value in a CIE L*a*b* (CIELAB or Lab) color space) that is between 65 and 75, between 48 and 82, between 60 and 72, between 65 and 71, between 40 and 76, or other neutral lightness values (e.g., where an L* value of 100 corresponds to white and an L* value of 0 corresponds to black). At the same time, neutral-color base layer 74 may exhibit an |a*| value (e.g., in the L*a*b* color space, where a* is a function of the difference between red and green channels and "| |" is the absolute value operator) that is less than approximately 2 (e.g., an a* value that is −1, 0, 1, 1.5, −1.5, 1.9, 0.5, etc.). Similarly, neutral-color base layer 74 may exhibit a |b*| value (e.g., in the L*a*b* color space, where b* is a function of the difference between blue and green channels) that is less than approximately 2 (e.g., an b* value that is −1, 0, 1, 1.5, −1.5, 1.9, 0.5, etc.).

Neutral-color base layer 74 may have thickness 80 and index of refraction $n_2$. As an example, neutral-color base layer 74 may be formed from chromium silicon carbonitride (CrSiCN), chromium nitride (CrN), chromium silicon nitride (CrSiN), carbide, carbonitride, other metal nitrides, or other materials. The relative number of chromium, silicon, carbon, and nitrogen atoms in neutral-color base layer 74 (e.g., in scenarios where layer 74 is formed from CrSiCN) may, for example, be selected to provide neutral-color base layer 74 with the desired neutral color profile and the desired index of refraction $n_2$. Thickness 80 may be, for example, greater than or equal to 0.1 microns, 0.2 microns, 0.3 microns, 0.4 microns, 0.5 microns, 0.6 microns, 0.7 microns, 0.8 microns, between 0.4 and 0.8 microns, between 0.5 and 0.75 microns, between 0.65 and 0.75 microns, etc.

Coating 68 may include an uppermost (top) layer that is formed from a single-layer interference film such as single-layer interference film 76. Single-layer interference film 76 may include a single layer (film) deposited on neutral-color base layer 74. Single-layer interference film 76 may have a thickness 78 and an index of refraction $n_1$ that is different from the index of refraction $n_2$ of neutral-color base layer 74 and the index of refraction no of air. Index of refraction $n_1$ may, for example, be greater than no and less than $n_2$. If desired, the materials in single-layer interference film 76 may also be configured to absorb some wavelengths of light, such that single-layer interference film 76 has an absorption coefficient k that is less than 1 and greater than 0.

Single-layer interference film 76 may form a thin film interference filter for coating 68. For example, incoming light 44 may reflect off of the exterior surface (interface) of single-layer interference film 76 as reflected light 44". Incoming light 44 may also be refracted and transmitted through single-layer interference film 76. Because neutral-color base layer 74 exhibits an index of refraction $n_2$ that is different from the index of refraction $n_1$ of single-layer interference film 76, light 44 may also be reflected off of the surface (interface) between single-layer interference film 76 and neutral-color base layer 74 as reflected light 44'. Reflected light 44' may be transmitted through single-layer interference film 76 and may constructively and destructively interfere at different wavelengths with reflected light 44".

By controlling the thickness 78 of single-layer interference film 76 as well as the optical characteristics of single-layer interference film 76 (e.g., absorption coefficient k and index of refraction $n_1$), reflected light 44" and 44' may destructively and/or constructively interfere at a selected set of wavelengths such that the combination of reflected light 44" and 44' are perceived by an observer with a desired color. As an example, thickness 78 may be between approximately 20 nm and 100 nm (e.g., between 30 nm and 70 nm, between 20 nm and 80 nm, between 35 nm and 75 nm, between 0.05 and 0.07 microns, etc.) to provide the combination of reflected light 44" and 44' with a desired color (e.g., a blue or purple color). Thickness 78 may, for example, be less than thickness 80. Thickness 80 may be less than, equal to, or greater than thickness 82. Coating 68 may have a total thickness H. Total thickness H may be, for example, between 1.2 and 1.8 microns, between 1.3 and 1.7 microns, between 1.4 and 1.6 microns, between 1.1 and 1.9 microns, or other thicknesses.

The composition of single-layer interference film 76 may also be selected to provide single-layer interference film 76 with a desired index of refraction $n_1$ and absorption coefficient k that contribute to the observed color response of coating 68 (e.g., to provide single-layer interference film 76 with a non-zero absorption coefficient at some wavelengths that helps to tune the observed color of the combination of reflected light 44" and 44'). As examples, single-layer interference film 76 may include metal carbonitrides or carbonoxynitrides or other materials.

Figure 5:
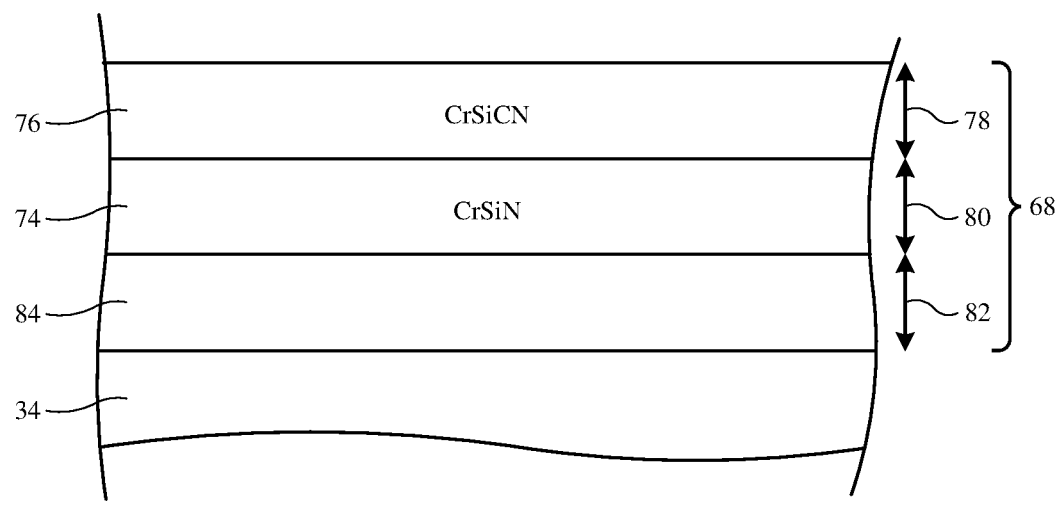
FIG. 5 is a cross-sectional side view of an illustrative coating of the type shown in FIG. 4, having a single-layer interference film formed from chromium silicon carbonitride in accordance with some embodiments.

Single-layer interference film 76 may, for example, include chromium silicon carbonitride (CrSiCN), as shown in the cross-sectional side view of FIG. 5. As shown in FIG. 5, single-layer interference film 76 may be a CrSiCN layer. Neutral-color base layer 74 may be a CrSiN layer or a layer formed using other suitable materials. Neutral-color base layer 74 may have thickness 80. Single-layer interference film 76 may have thickness 78. The composition of neutral-color base layer 74, the composition of single-layer interference film 76, thickness 80, and/or thickness 78 may be selected to provide coating 68 with a desired visual (observed) color such as a blue color (or any other desired colors). In scenarios where coating 68 is configured to produce a blue color, the composition of single-layer interference film 76 and thickness 78 may have the greatest impact on the reflective color response of coating 68.

As examples, thickness 82 may be between 0.2 and 1.5 microns, between 0.5 and 1.25 microns, between 1.0 and 2.0 microns, between 1.1 and 1.3 microns, between 1.05 and 1.25 microns, between 0.75 and 1.5 microns, greater than 1.0 micron, less than 2.0 microns, etc. Thickness 80 may be between 0.1 and 0.5 microns, between 0.15 and 0.45 microns, between 0.3 and 0.4 microns, between 0.2 and 0.3 microns, between 0.25 and 0.5 microns, between 0.27 and 0.33 microns, between 0.24 and 0.49 microns, greater than 0.2 microns, less than 0.5 microns, less than 1.0 micron, greater than 0.1 micron, or other desired thicknesses. Thickness 78 may be between 0.01 and 0.1 microns, between 0.05 and 0.07 microns, between 0.01 and 0.2 microns, between 0.05 and 0.15 microns, between 0.03 and 0.22 microns, greater than 0.01 microns, greater than 0.05 microns, less than 0.08 microns, less than 0.1 microns, less than 0.2 microns, or other desired thicknesses.

Figure 6:
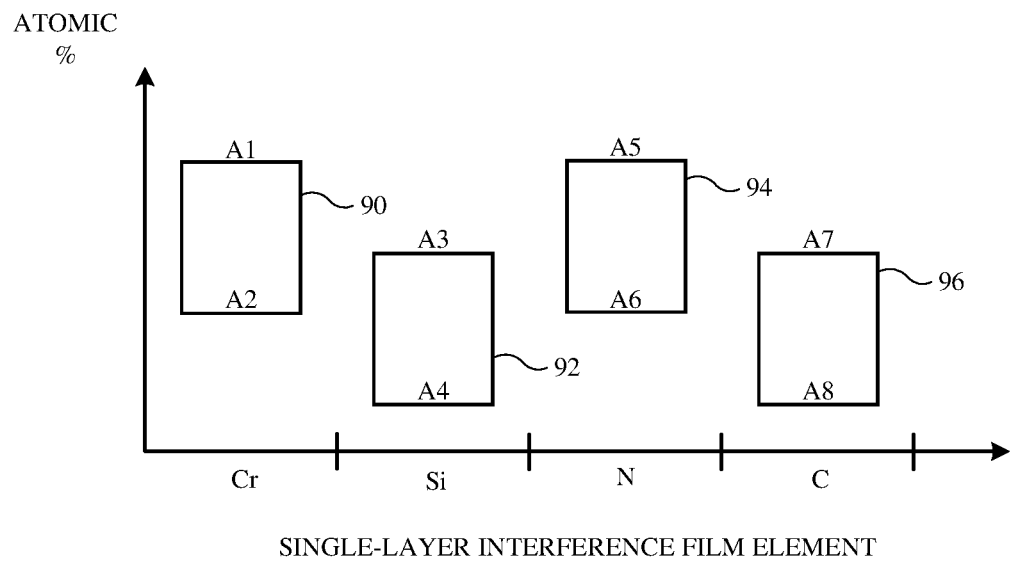
FIG. 6 is a plot of the atomic percentage of different elements in an illustrative single-layer interference film for a coating of the type shown in FIG. 5 in accordance with some embodiments.

FIG. 6 is a plot of illustrative atomic percentages for the different elements in single-layer interference film 76 in examples where single-layer interference film 76 is a CrSiCN layer (e.g., in the configuration of coating 68 as shown in FIG. 5, such as a configuration in which coating 68 is configured to exhibit a blue color). As shown in FIG. 6, the composition of single-layer interference film 76 may be selected such that the atomic percentage of chromium (Cr) atoms in single-layer interference film 76 lies within region 90 (e.g., a region extending between upper limit A1 and lower limit A2). The atomic percentage of silicon (Si) atoms in single-layer interference film 76 lies within region 92 (e.g., a region extending between upper limit A3 and lower limit A4). The atomic percentage of nitrogen (N) atoms in single-layer interference film 76 lies within region 94 (e.g., a region extending between upper limit A5 and lower limit A6). The atomic percentage of carbon (C) atoms in single-layer interference film 76 lies within region 96 (e.g., a region extending between upper limit A7 and lower limit A8).

In the example of FIG. 6, atomic percentage A1 is greater than atomic percentage A5, which is greater than atomic percentage A3, which is greater than atomic percentage A7, and atomic percentage A6 is greater than atomic percentage A2, which is greater than atomic percentage A4, which is greater than atomic percentage A8. This is merely illustrative and, in general, these percentages may have other relative magnitudes. Regions 90, 92, 94, and 96 may have other relative positions along the vertical axis of FIG. 6 and may have other relative sizes (e.g., where the size of each region is determined by the difference between its corresponding upper and lower limits).

As an example, the upper limit A1 of region 90 (e.g., the upper limit on the atomic percentage of Cr atoms in single-layer interference film 76) may be between 30% and 40%, between 34% and 36%, between 31% and 39%, between 33% and 41%, between 35% and 45%, greater than 35%, greater than 30%, or other values. The lower limit A2 of region 90 (e.g., the lower limit on the atomic percentage of Cr atoms in single-layer interference film 76) may be between 30% and 40%, between 20% and 35%, between 25% and 35%, between 30% and 32%, less than 35%, less than 30%, less than 40%, or other values less than upper limit A1.

The upper limit A3 of region 92 (e.g., the upper limit on the atomic percentage of Si atoms in film 76) may be between 20% and 40%, between 25% and 30%, between 26% and 28%, between 21% and 34%, greater than 25%, greater than 20%, greater than 22%, less than 30%, less than 40%, or other values. The lower limit A4 of region 92 (e.g., the lower limit on the atomic percentage of Si atoms in film 76) may be between 20% and 30%, between 22% and 24%, between 21% and 31%, between 15% and 25%, less than 30%, less than 35%, less than 40%, greater than 20%, greater than 15%, or other values less than upper limit A3.

The upper limit A5 of region 94 (e.g., the upper limit on the atomic percentage of N atoms in film 76) may be between 30% and 40%, between 35% and 45%, between 36% and 38%, between 31% and 39%, greater than 30%, greater than 35%, greater than 27%, less than 37%, less than 40%, less than 45%, or other values. The lower limit A6 of region 94 (e.g., the lower limit on the atomic percentage of N atoms in film 76) may be between 30% and 40%, between 31% and 45%, between 32% and 34%, greater than 30%, greater than 25%, less than 36%, less than 45%, less than 52%, or other values less than upper limit A5.

The limits of region 96 may be defined by the balance of atomic percentage remaining in film 76. For example, the upper limit A7 of region 96 (e.g., the upper limit on the atomic percentage of C atoms in film 76) may be between 10% and 20%, between 12% and 14%, between 5% and 15%, greater than 10%, greater than 5%, greater than 1%, less than 15%, less than 10%, less than 5%, less than 2%, less than 1%, or other values. The lower limit A8 of region 92 (e.g., the lower limit on the atomic percentage of C atoms in film 76) may be between 1% and 2%, between 0.5% and 1.5%, between 0.2% and 1.2%, between 1% and 10%, between 3% and 15%, less than 5%, less than 2%, less than 1%, greater than 0.2%, greater than 0.5%, or other values less than upper limit A7. These examples are merely illustrative and, in general, other atomic percentages of these elements may be used (e.g., regions 90, 92, 94, and 96 may have other heights, relative positions, and/or relative sizes).

Figure 7:
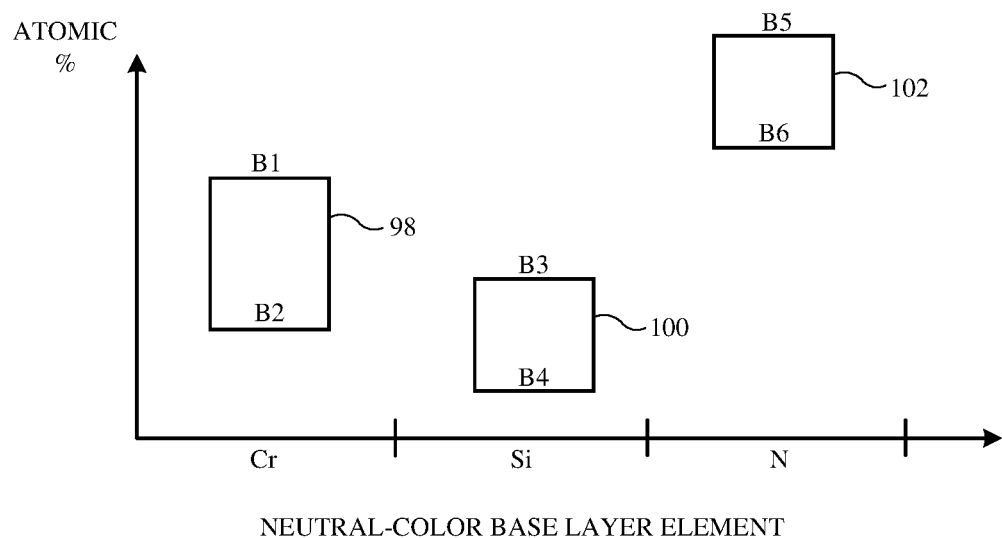
FIG. 7 is a plot of the atomic percentage of different elements in an illustrative neutral-color base layer for a coating of the type shown in FIG. 5 in accordance with some embodiments.

FIG. 7 is a plot of illustrative atomic percentages for the different elements in neutral-color base layer 74 in examples where neutral-color base layer 74 is a CrSiN layer (e.g., in the configuration of coating 68 as shown in FIG. 5, such as a configuration in which coating 68 is configured to produce a blue color with a CrSiCN single-layer interference film 76). As shown in FIG. 7, the composition of neutral-color base layer 74 may be selected such that the atomic percentage of Cr atoms in layer 74 lies within region 98 (e.g., a region extending between upper limit B1 and lower limit B2). The atomic percentage of Si atoms in layer 74 lies within region 100 (e.g., a region extending between upper limit B3 and lower limit B4). The atomic percentage of N atoms in layer 74 lies within region 102 (e.g., a region extending between upper limit B5 and lower limit B6).

In the example of FIG. 7, atomic percentage B5 is greater than atomic percentage B1, which is greater than atomic percentage B3, and atomic percentage B6 is greater than atomic percentage B2, which is greater than atomic percentage B4. This is merely illustrative and, in general, these percentages may have other relative magnitudes. Regions 98, 100, and 102 may have other relative positions along the vertical axis of FIG. 7 and may have other relative sizes (e.g., where the size of each region is determined by the difference between its corresponding upper and lower limits).

As an example, the upper limit B1 of region 98 (e.g., the upper limit on the atomic percentage of Cr atoms in layer 74) may be between 30% and 40%, between 35% and 40%, between 37% and 39%, between 33% and 41%, between 35% and 45%, greater than 35%, greater than 30%, less than 40%, less than 45%, or other values. The lower limit B2 of region 98 (e.g., the lower limit on the atomic percentage of Cr atoms in layer 74) may be between 30% and 40%, between 20% and 35%, between 30% and 35%, between 33% and 35%, less than 35%, less than 30%, less than 40%, or other values less than upper limit B1.

The upper limit B3 of region 100 (e.g., the upper limit on the atomic percentage of Si atoms in layer 74) may be between 10% and 20%, between 5% and 15%, between 13% and 15%, greater than 10%, greater than 12%, greater than 5%, less than 15%, less than 20%, or other values. The lower limit B4 of region 100 (e.g., the lower limit on the atomic percentage of Si atoms in layer 74) may be between 10% and 20%, between 5% and 20%, between 6% and 14%, between 11% and 13%, less than 14%, less than 15%, less than 20%, less than 10%, greater than 10%, greater than 5%, or other values less than upper limit B3.

The limits of region 102 may be defined by the balance of atomic percentage remaining in layer 74. For example, the upper limit B5 of region 102 (e.g., the upper limit on the atomic percentage of N atoms in layer 74) may be between 30% and 60%, between 50% and 59%, between 53% and 55%, greater than 50%, greater than 45%, greater than 40%, less than 60%, less than 70%, less than 55%, less than 52%, less than 50%, or other values. The lower limit B6 of region 102 (e.g., the lower limit on the atomic percentage of N atoms in layer 74) may be between 40% and 50%, between 45% and 51%, between 47% and 49%, between 31% and 60%, less than 50%, less than 52%, less than 45%, greater than 45%, greater than 40%, greater than 50%, or other values less than upper limit B5. These examples are merely illustrative and, in general, other atomic percentages of these elements may be used (e.g., regions 98, 100, 102 may have other heights, relative positions, and/or relative sizes).

When configured in this way, coating 68 of FIG. 5 may exhibit a desired color such as a blue color. As an example, coating 68 of FIG. 5 may have an L* value between 40 and 60, between 45 and 50, between 46 and 49, between 30 and 60, between 40 and 50, between 35 and 55, between 42 and 49, or other L* values in the CIELAB color space. Coating 68 of FIG. 5 may, for example, have an a* value between −10 and 0, between −5 and 0, between −4 and −3, between −2 and −5, between −1 and −6, or other a* values in the CIELAB color space. Coating 68 of FIG. 5 may, for example, have a b* value between −5 and −15, between −8 and −12, between −10 and −11, between −9 and −14, or other b* values in the CIELAB color space.

If desired, CrSiN layer 74 of FIG. 5 may be replaced with a CrSiCN layer (e.g., neutral color base layer 74 may include CrSiCN). In these arrangements, upper limit A1 may be between 30-40%, between 33-37%, greater than 31%, less than 36%, or other values. Lower limit A2 may be 30-35%, 25-33%, greater than 30%, less than 35%, or other values less than upper limit A1. Upper limit A5 may be between 35-40%, greater than 35%, less than 40%, or other values. Lower limit A6 may be between 30-35%, less than 35%, greater than 30%, or other values less than upper limit A5. In this example, coating 68 may have an L* value between 40 and 50, between 45 and 50, between 46 and 52, greater than 45, greater than 40, less than 50, less than 55, or other L* values. Coating 68 may have an a* value between −5 and 0, between −4 and −3, between −5 and 5, less than 0, less than −3, greater than −4, greater than −5, or other a* values. Coating 68 may have a b* value between −10 and −15, between −5 and −15, less than −10, greater than −15, greater than −11, or other b* values.

Figure 8:
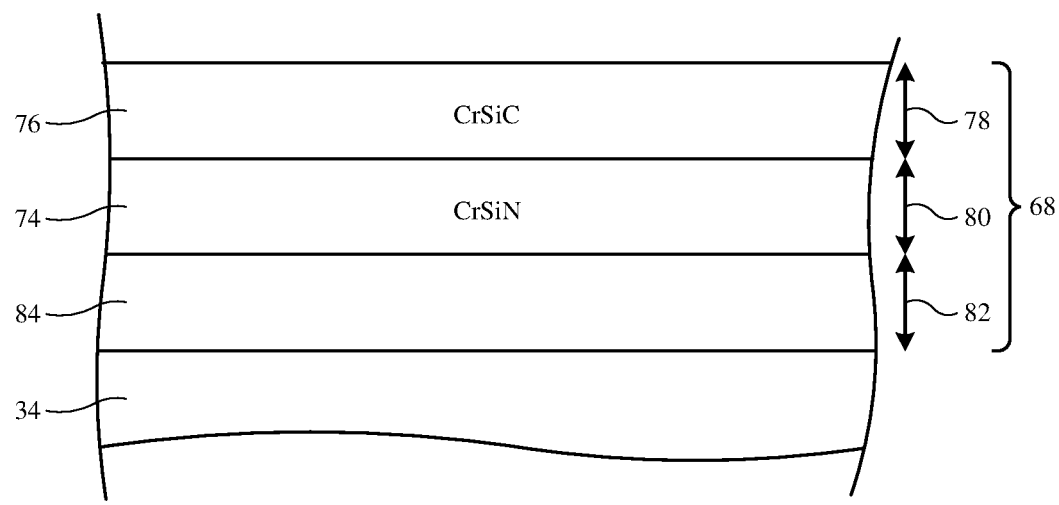
FIG. 8 is a cross-sectional side view of an illustrative coating of the type shown in FIG. 4, having a single-layer interference film formed from chromium silicon carbide in accordance with some embodiments.

If desired, single-layer interference film 76 may, for example, include chromium silicon carbide (CrSiC), as shown in the cross-sectional side view of FIG. 8. As shown in FIG. 8, single-layer interference film 76 may be a CrSiC layer. Neutral-color base layer 74 may be a CrSiN layer or a layer formed using other suitable materials. The composition of neutral-color base layer 74, the composition of single-layer interference film 76, thickness 80, and/or thickness 78 of coating 68 of FIG. 8 may have a first configuration selected to provide coating 68 with a first visual (observed) color such as a blue color (or any other desired colors).

As examples, thickness 82 may be between 0.2 and 1.5 microns, between 0.5 and 1.25 microns, between 0.5 and 1.5 microns, between 0.6 and 0.8 microns, between 0.55 and 0.75 microns, between 0.25 and 1.0 microns, greater than 0.5 micron, less than 1.5 microns, etc. Thickness 80 may be between 0.5 and 1.5 microns, between 0.9 and 1.1 microns, between 0.3 and 1.4 microns, between 0.2 and 2.3 microns, between 0.25 and 1.5 microns, between 0.97 and 1.13 microns, greater than 0.5 microns, less than 1.5 microns, less than 1.2 microns, greater than 0.8 microns, or other desired thicknesses. Thickness 78 may be between 0.01 and 0.1 microns, between 0.04 and 0.06 microns, between 0.01 and 0.2 microns, between 0.04 and 0.14 microns, between 0.03 and 0.22 microns, greater than 0.01 microns, greater than 0.03 microns, less than 0.07 microns, less than 0.1 microns, less than 0.2 microns, or other desired thicknesses.

Figure 9:
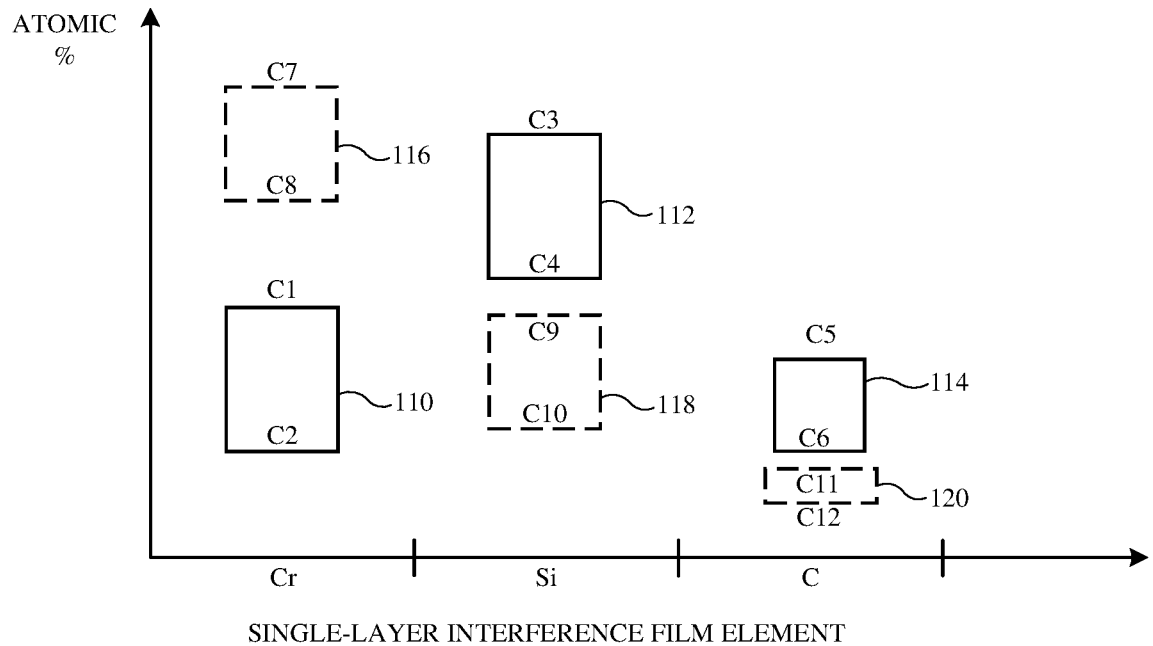
FIG. 9 is a plot of the atomic percentage of different elements in an illustrative single-layer interference film for a coating of the type shown in FIG. 8 in accordance with some embodiments.

FIG. 9 is a plot of illustrative atomic percentages for the different elements in single-layer interference film 76 in examples where single-layer interference film 76 is a CrSiC layer that reflects light of the first color (e.g., in the first configuration of coating 68 as shown in FIG. 8, where coating 68 is configured to exhibit a blue color). As shown in FIG. 9, the composition of single-layer interference film 76 may be selected such that the atomic percentage of Cr atoms in single-layer interference film 76 lies within region 110 (e.g., a region extending between upper limit C1 and lower limit C2). The atomic percentage of Si atoms in single-layer interference film 76 lies within region 112 (e.g., a region extending between upper limit C3 and lower limit C4). The atomic percentage of C atoms in single-layer interference film 76 lies within region 114 (e.g., a region extending between upper limit C5 and lower limit C6).

In the example of FIG. 9, atomic percentage C3 is greater than atomic percentage C1, which is greater than atomic percentage C5, and atomic percentage C4 is greater than atomic percentage C2, which is greater than atomic percentage C6. This is merely illustrative and, in general, these percentages may have other relative magnitudes. Regions 110, 112, and 114 may have other relative positions along the vertical axis of FIG. 9 and may have other relative sizes (e.g., where the size of each region is determined by the difference between its corresponding upper and lower limits).

As an example, the upper limit C1 of region 110 (e.g., the upper limit on the atomic percentage of Cr atoms in single-layer interference film 76) may be between 30% and 40%, between 28% and 36%, between 31% and 33%, between 20% and 50%, between 27% and 38%, greater than 30%, greater than 25%, less than 40%, less than 35%, or other values. The lower limit C2 of region 110 (e.g., the lower limit on the atomic percentage of Cr atoms in single-layer interference film 76) may be between 20% and 40%, between 20% and 30%, between 27% and 29%, between 25% and 35%, less than 35%, less than 30%, less than 40%, or other values less than upper limit C1.

The upper limit C3 of region 112 (e.g., the upper limit on the atomic percentage of Si atoms in film 76) may be between 50% and 60%, between 45% and 65%, between 50% and 70%, between 57% and 59%, greater than 55%, greater than 50%, greater than 40%, less than 60%, less than 70%, or other values. The lower limit C4 of region 112 (e.g., the lower limit on the atomic percentage of Si atoms in film 76) may be between 50% and 60%, between 45% and 55%, between 51% and 53%, between 41% and 57%, less than 60%, less than 55%, less than 70%, greater than 45%, greater than 50%, or other values less than upper limit C3.

The upper limit C5 of region 114 (e.g., the upper limit on the atomic percentage of C atoms in film 76) may be between 10% and 20%, between 13% and 15%, between 8% and 18%, between 5% and 15%, greater than 10%, greater than 5%, greater than 13%, less than 15%, less than 20%, less than 35%, or other values. The lower limit C6 of region 114 (e.g., the lower limit on the atomic percentage of C atoms in film 76) may be between 10% and 20%, between 10% and 15%, between 7% and 13%, between 11% and 13%, greater than 10%, greater than 5%, less than 15%, less than 20%, less than 25%, or other values less than upper limit C5. These examples are merely illustrative and, in general, other atomic percentages of these elements may be used (e.g., regions 110, 112, and 114 may have other heights, relative positions, and/or relative sizes).

Figure 10:
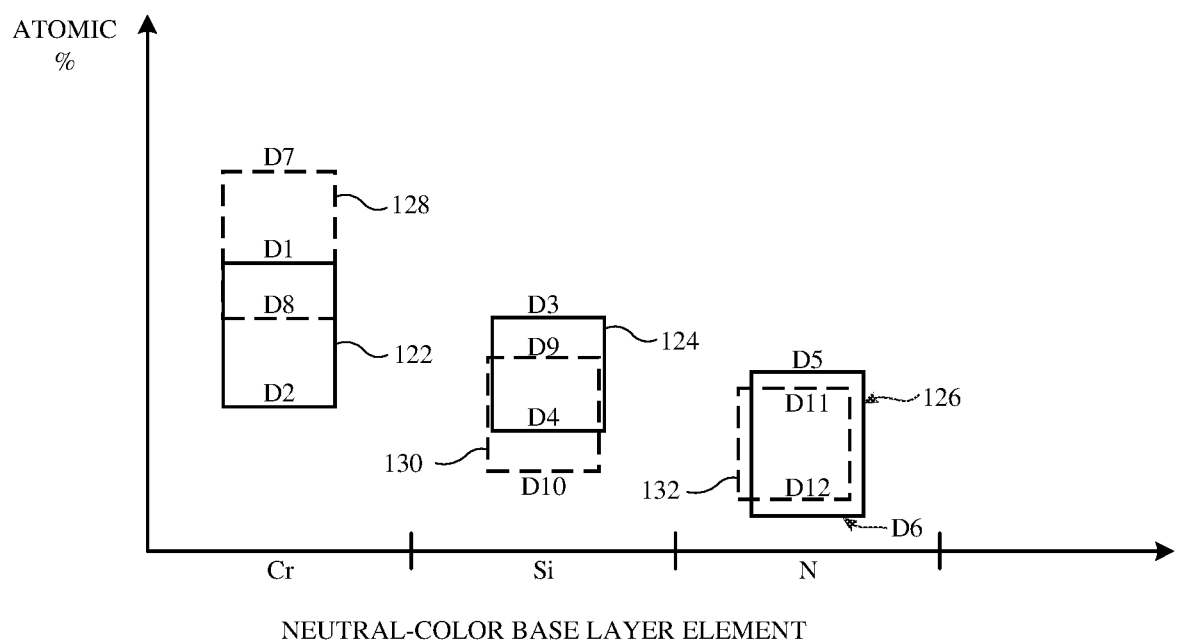
FIG. 10 is a plot of the atomic percentage of different elements in an illustrative neutral-color base layer for a coating of the type shown in FIG. 8 in accordance with some embodiments.

FIG. 10 is a plot of illustrative atomic percentages for the different elements in neutral-color base layer 74 in examples where neutral-color base layer 74 is a CrSiN layer (e.g., in the first configuration of coating 68 as shown in FIG. 8, where coating 68 is configured to exhibit a blue color with a CrSiC single-layer interference film 76). As shown in FIG. 10, the composition of neutral-color base layer 74 may be selected such that the atomic percentage of Cr atoms in layer 74 lies within region 122 (e.g., a region extending between upper limit D1 and lower limit D2). The atomic percentage of Si atoms in layer 74 lies within region 124 (e.g., a region extending between upper limit D3 and lower limit D4). The atomic percentage of N atoms in layer 74 lies within region 126 (e.g., a region extending between upper limit D5 and lower limit D6).

In the example of FIG. 10, atomic percentage D1 is greater than atomic percentage D3, which is greater than atomic percentage D5, and atomic percentage D2 is greater than atomic percentage D4, which is greater than atomic percentage D6. This is merely illustrative and, in general, these percentages may have other relative magnitudes. Regions 122, 124, and 126 may have other relative positions along the vertical axis of FIG. 10 and may have other relative sizes (e.g., where the size of each region is determined by the difference between its corresponding upper and lower limits).

As an example, the upper limit D1 of region 122 (e.g., the upper limit on the atomic percentage of Cr atoms in layer 74) may be between 60% and 70%, between 55% and 65%, between 61% and 63%, between 50% and 70%, between 51% and 67%, greater than 60%, greater than 50%, less than 70%, less than 75%, or other values. The lower limit D2 of region 122 (e.g., the lower limit on the atomic percentage of Cr atoms in layer 74) may be between 50% and 60%, between 55% and 57%, between 55% and 65%, between 49% and 57%, less than 60%, less than 70%, less than 75%, or other values less than upper limit D1.

The upper limit D3 of region 124 (e.g., the upper limit on the atomic percentage of Si atoms in layer 74) may be between 20% and 30%, between 24% and 26%, between 17% and 28%, greater than 20%, greater than 22%, greater than 15%, less than 30%, less than 35%, or other values. The lower limit D4 of region 124 (e.g., the lower limit on the atomic percentage of Si atoms in layer 74) may be between 20% and 30%, between 20% and 22%, between 16% and 24%, between 11% and 33%, less than 24%, less than 25%, less than 30%, less than 40%, greater than 10%, greater than 20%, or other values less than upper limit D3.

The limits of region 126 may be defined by the balance of atomic percentage remaining in layer 74. For example, the upper limit D5 of region 126 (e.g., the upper limit on the atomic percentage of N atoms in layer 74) may be between 20% and 30%, between 22% and 24%, between 15% and 25%, greater than 20%, greater than 15%, greater than 10%, less than 25%, less than 30%, less than 35%, less than 32%, less than 40%, or other values. The lower limit D6 of region 126 (e.g., the lower limit on the atomic percentage of N atoms in layer 74) may be between 10% and 20%, between 12% and 14%, between 8% and 17%, between 5% and 25%, less than 15%, less than 20%, less than 25%, greater than 10%, greater than 5%, greater than 8%, or other values less than upper limit D5. These examples are merely illustrative and, in general, other atomic percentages of these elements may be used (e.g., regions 122, 124, 126 may have other heights, relative positions, and/or relative sizes).

In another suitable arrangement, the composition of neutral-color base layer 74, the composition of single-layer interference film 76, thickness 80, and/or thickness 78 in the arrangement of FIG. 8 may have a second configuration selected to provide coating 68 with a second visual (observed) color such as a purple color.

As examples, thickness 82 may be the same as in scenarios where coating 68 of FIG. 8 is configured to exhibit the first color (e.g., a blue color). Similarly, thickness 82 may be the same as in scenarios where coating 68 of FIG. 8 is configured to exhibit the first color (e.g., a blue color). However, thickness 78 may be between 0.03 and 0.04 microns, between 0.034 and 0.036 microns, between 0.01 and 0.04 microns, between 0.02 and 0.039 microns, between 0.025 and 0.075 microns, between 0.2 and 1.0 microns, greater than 0.03 microns, greater than 0.02 microns, less than 0.04 microns, or other desired thicknesses.

Returning to FIG. 9, when coating 68 of FIG. 8 is configured to exhibit the second (e.g., purple) color, the composition of single-layer interference film 76 may be selected such that the atomic percentage of Cr atoms in single-layer interference film 76 lies within region 116 (e.g., a region extending between upper limit C7 and lower limit C8), the atomic percentage of Si atoms in single-layer interference film 76 lies within region 118 (e.g., a region extending between upper limit C9 and lower limit C10), and the atomic percentage of C atoms in single-layer interference film 76 lies within region 120 (e.g., a region extending between upper limit C11 and lower limit C12).

In the example of FIG. 9, atomic percentage C7 is greater than atomic percentage C9, which is greater than atomic percentage C11, and atomic percentage C8 is greater than atomic percentage C10, which is greater than atomic percentage C12. This is merely illustrative and, in general, these percentages may have other relative magnitudes. Regions 116, 118, and 120 may have other relative positions along the vertical axis of FIG. 9 and may have other relative sizes (e.g., where the size of each region is determined by the difference between its corresponding upper and lower limits).

As an example, the upper limit C7 of region 116 (e.g., the upper limit on the atomic percentage of Cr atoms in single-layer interference film 76) may be between 50% and 60%, between 56% and 58%, between 53% and 59%, between 45% and 65%, between 51% and 58%, greater than 55%, greater than 50%, less than 60%, less than 65%, or other values. The lower limit C8 of region 116 (e.g., the lower limit on the atomic percentage of Cr atoms in single-layer interference film 76) may be between 50% and 60%, between 45% and 55%, between 41% and 62%, between 45% and 52%, less than 55%, less than 60%, less than 65%, or other values less than upper limit C7.

The upper limit C9 of region 118 (e.g., the upper limit on the atomic percentage of Si atoms in film 76) may be between 30% and 40%, between 35% and 37%, between 25% and 40%, between 31% and 39%, greater than 35%, greater than 30%, greater than 25%, less than 40%, less than 50%, or other values. The lower limit C10 of region 118 (e.g., the lower limit on the atomic percentage of Si atoms in film 76) may be between 30% and 40%, between 31% and 33%, between 26% and 33%, between 21% and 37%, less than 35%, less than 40%, less than 50%, greater than 30%, greater than 25%, or other values less than upper limit C9.

The upper limit C11 of region 120 (e.g., the upper limit on the atomic percentage of C atoms in film 76) may be between 1% and 10%, between 2% and 15%, between 3% and 18%, between 5% and 10%, between 8% and 10%, greater than 5%, greater than 2%, greater than 6%, less than 10%, less than 15%, less than 30%, or other values. The lower limit C12 of region 120 (e.g., the lower limit on the atomic percentage of C atoms in film 76) may be between 1% and 10%, between 1% and 8%, between 6% and 8%, between 2% and 13%, greater than 5%, greater than 1%, less than 10%, less than 8%, less than 15%, or other values less than upper limit C11. These examples are merely illustrative and, in general, other atomic percentages of these elements may be used (e.g., regions 116, 118, and 120 may have other heights, relative positions, and/or relative sizes). Region 116 may have any desired position and size relative to region 110, region 112 may have any desired position and size relative to region 118, and region 114 may have any desired position and size relative to region 120.

As shown in FIG. 10, when coating 68 of FIG. 8 is configured to exhibit the second (e.g., purple) color, the composition of neutral-color base layer 74 may be selected such that the atomic percentage of Cr atoms in layer 74 lies within region 128 (e.g., a region extending between upper limit D7 and lower limit D8), the atomic percentage of Si atoms in layer 74 lies within region 130 (e.g., a region extending between upper limit D9 and lower limit D10), and the atomic percentage of N atoms in layer 74 lies within region 132 (e.g., a region extending between upper limit D11 and lower limit D12).

In the example of FIG. 10, atomic percentage D7 is greater than atomic percentage D9, which is greater than atomic percentage D11, and atomic percentage D8 is greater than atomic percentage D10, which is greater than atomic percentage D12. This is merely illustrative and, in general, these percentages may have other relative magnitudes. Regions 128, 130, and 132 may have other relative positions along the vertical axis of FIG. 10 and may have other relative sizes (e.g., where the size of each region is determined by the difference between its corresponding upper and lower limits).

As an example, the upper limit D7 of region 128 (e.g., the upper limit on the atomic percentage of Cr atoms in layer 74) may be between 65% and 75%, between 69% and 71%, between 60% and 80%, between 45% and 75%, greater than 65%, greater than 55%, less than 70%, less than 75%, or other values. The lower limit D8 of region 128 (e.g., the lower limit on the atomic percentage of Cr atoms in layer 74) may be between 60% and 70%, between 60% and 65%, between 61% and 63%, between 51% and 71%, less than 65%, less than 70%, less than 75%, greater than 55%, greater than 60%, or other values less than upper limit D7.

The upper limit D9 of region 130 (e.g., the upper limit on the atomic percentage of Si atoms in layer 74) may be between 20% and 30%, between 21% and 23%, between 17% and 28%, greater than 20%, greater than 22%, greater than 15%, less than 30%, less than 25%, or other values. The lower limit D10 of region 130 (e.g., the lower limit on the atomic percentage of Si atoms in layer 74) may be between 10% and 20%, between 10% and 25%, between 17% and 19%, between 11% and 33%, less than 20%, less than 25%, less than 30%, less than 40%, greater than 10%, greater than 15%, or other values less than upper limit D9.

The limits of region 132 may be defined by the balance of atomic percentage remaining in layer 74. For example, the upper limit D11 of region 132 (e.g., the upper limit on the atomic percentage of N atoms in layer 74) may be between 15% and 25%, between 18% and 24%, between 19% and 21%, greater than 15%, greater than 10%, greater than 5%, less than 25%, less than 30%, less than 35%, less than 32%, less than 40%, or other values. The lower limit D12 of region 132 (e.g., the lower limit on the atomic percentage of N atoms in layer 74) may be between 1% and 10%, between 5% and 15%, between 7% and 9%, less than 10%, less than 15%, less than 25%, greater than 5%, greater than 2%, or other values less than upper limit D11. These examples are merely illustrative and, in general, other atomic percentages of these elements may be used (e.g., regions 128, 130, 132 may have other heights, relative positions, and/or relative sizes). Region 128 may have any desired position and size relative to region 122, region 124 may have any desired position and size relative to region 130, and region 126 may have any desired position and size relative to region 132. Neutral-color base layer 74 may be formed using other elements in any of these configurations if desired.

When configured to exhibit the first color (e.g., the blue color), coating 68 of FIG. 8 may, for example, have an L* value between 40 and 60, between 45 and 55, between 50 and 60, between 50 and 51, between 49 and 52, between 48 and 53, between 50 and 52, or other L* values in the CIELAB color space. Coating 68 of FIG. 8 may, for example, have an a* value between −10 and 0, between −5 and 0, between −4 and −2, between −1 and −5, between −1 and −4, between −2.5 and −3.5, or other a* values in the CIELAB color space. Coating 68 of FIG. 8 may, for example, have a b* value between −5 and −15, between −10 and −14, between −12 and −13, between −11 and −14, or other b* values in the CIELAB color space.

When configured to exhibit the second color (e.g., the purple color), coating 68 of FIG. 8 may, for example, have an L* value between 30 and 40, between 35 and 45, between 35 and 40, between 36 and 39, between 35 and 38, or other L* values in the CIELAB color space. Coating 68 of FIG. 8 may, for example, have an a* value between 0 and 10, between 0 and 5, between 2 and 4, between 1 and 4, between 2 and 3, between 2.5 and 3.5, or other a* values in the CIELAB color space. Coating 68 of FIG. 8 may, for example, have a b* value between −5 and −15, between −5 and −10, between −7 and −8, between −6 and −9, or other b* values in the CIELAB color space.

The example of FIGS. 4-10 in which coating 68 includes a single-layer interference film 76 is merely illustrative. In another suitable arrangement, single-layer interference film 76 of FIGS. 4-10 may be replaced by a multi-layer thin film interference filter (e.g., a filter having multiple stacked films of alternating refractive indices, etc.) that provides coating 68 with a desired visible color.

Figure 11:
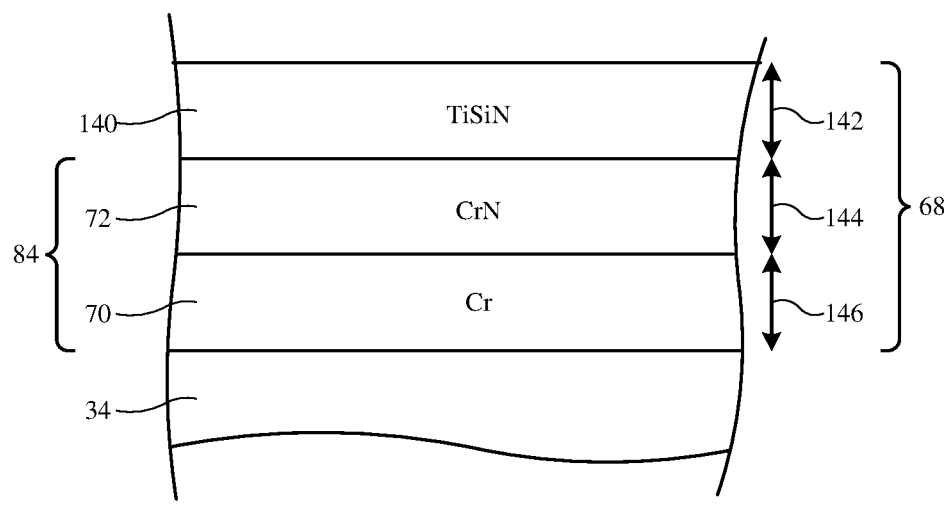
FIG. 11 is a cross-sectional side view of an illustrative coating having a color layer formed from titanium silicon nitride in accordance with some embodiments.

If desired, neutral-color base layer 74 and single-layer interference film 76 may be replaced by a color layer, as shown in the cross-sectional side view of FIG. 11. As shown in FIG. 11, coating 68 may include adhesion and transition layers 84 and color layer 140 on adhesion and transition layers 84. Color layer 140 may be an intrinsically-colored layer that preferentially absorbs light at particularly wavelengths to reveal the color of the reflected wavelengths to an observer. Adhesion and transition layers 84 may include seed layer 70 (e.g., a Cr seed layer) and transition layer 72 (e.g., a CrN transition layer). Color layer 140 may be a titanium silicon nitride (TiSiN) layer, as one example. Seed layer 70 has thickness 146 whereas transition layer 72 has thickness 144. Color layer 140 has thickness 142.

As examples, thickness 142 may be between 0.2 and 0.6 microns, between 0.3 and 0.5 microns, between 0.1 and 1.0 microns, between 0.1 and 0.5 microns, between 0.35 and 0.75 microns, greater than 0.3 microns, greater than 0.1 microns, less than 0.5 microns, less than 0.8 microns, etc. Thickness 144 may be between 0.5 and 1.5 microns, between 0.7 and 1.1 microns, between 0.3 and 1.4 microns, between 0.2 and 2.3 microns, between 0.25 and 1.5 microns, between 0.57 and 1.13 microns, greater than 0.5 microns, greater than 0.7 microns, less than 1.5 microns, less than 1.2 microns, greater than 0.8 microns, or other desired thicknesses. Thickness 146 may be between 0.1 and 0.3 microns, between 0.05 and 0.36 microns, greater than 0.1 microns, greater than 0.05 microns, less than 0.27 microns, less than 0.3 microns, or other desired thicknesses.

Figure 12:
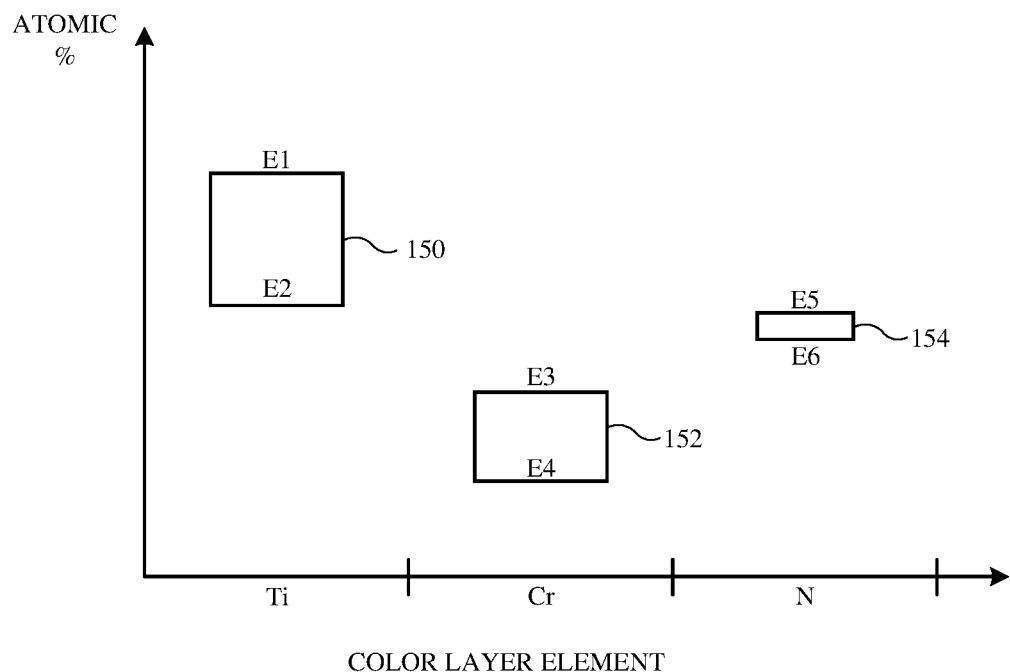
FIG. 12 is a plot of the atomic percentage of different elements in an illustrative color layer for a coating of the type shown in FIG. 11 in accordance with some embodiments.

FIG. 12 is a plot of illustrative atomic percentages for the different elements in color layer 140. As shown in FIG. 12, the composition of color layer 140 may be selected such that the atomic percentage of titanium (Ti) atoms in color layer 140 lies within region 150 (e.g., a region extending between upper limit E1 and lower limit E2). The atomic percentage of Cr atoms in color layer 140 lies within region 152 (e.g., a region extending between upper limit E3 and lower limit E4). The atomic percentage of N atoms in color layer 140 lies within region 154 (e.g., a region extending between upper limit E5 and lower limit E6).

In the example of FIG. 12, atomic percentage E1 is greater than atomic percentage E5, which is greater than atomic percentage E3, and atomic percentage E2 is greater than atomic percentage E6, which is greater than atomic percentage E4. This is merely illustrative and, in general, these percentages may have other relative magnitudes. Regions 150, 152, and 154 may have other relative positions along the vertical axis of FIG. 12 and may have other relative sizes (e.g., where the size of each region is determined by the difference between its corresponding upper and lower limits).

As an example, the upper limit E1 of region 150 (e.g., the upper limit on the atomic percentage of Ti atoms in color layer 140) may be between 50% and 60%, between 45% and 65%, between 54% and 56%, between 52% and 60%, greater than 50%, greater than 45%, less than 60%, less than 75%, or other values. The lower limit E2 of region 150 (e.g., the lower limit on the atomic percentage of Ti atoms in color layer 140) may be between 50% and 60%, between 45% and 55%, between 50% and 52%, between 41% and 59%, less than 55%, less than 60%, less than 52%, or other values less than upper limit E1.

The upper limit E3 of region 152 (e.g., the upper limit on the atomic percentage of Cr atoms in color layer 140) may be between 10% and 20%, between 12% and 16%, between 13% and 15%, between 5% and 25%, greater than 10%, greater than 12%, greater than 5%, less than 15%, less than 20%, or other values. The lower limit E4 of region 152 (e.g., the lower limit on the atomic percentage of Cr atoms in color layer 140) may be between 5% and 15%, between 9% and 11%, between 6% and 13%, less than 12%, less than 15%, less than 20%, greater than 5%, greater than 8%, or other values less than upper limit E3.

The upper limit E5 of region 154 (e.g., the upper limit on the atomic percentage of N atoms in color layer 140) may be between 30% and 40%, between 35% and 45%, between 38% and 40%, between 25% and 45%, greater than 35%, greater than 30%, greater than 25%, less than 40%, less than 45%, less than 50%, or other values. The lower limit E6 of region 154 (e.g., the lower limit on the atomic percentage of N atoms in color layer 140) may be between 30% and 40%, between 30% and 32%, between 27% and 33%, between 21% and 43%, greater than 30%, greater than 25%, less than 35%, less than 40%, less than 45%, or other values less than upper limit E5. These examples are merely illustrative and, in general, other atomic percentages of these elements may be used (e.g., regions 150, 152, and 154 may have other heights, relative positions, and/or relative sizes).

Figure 13:
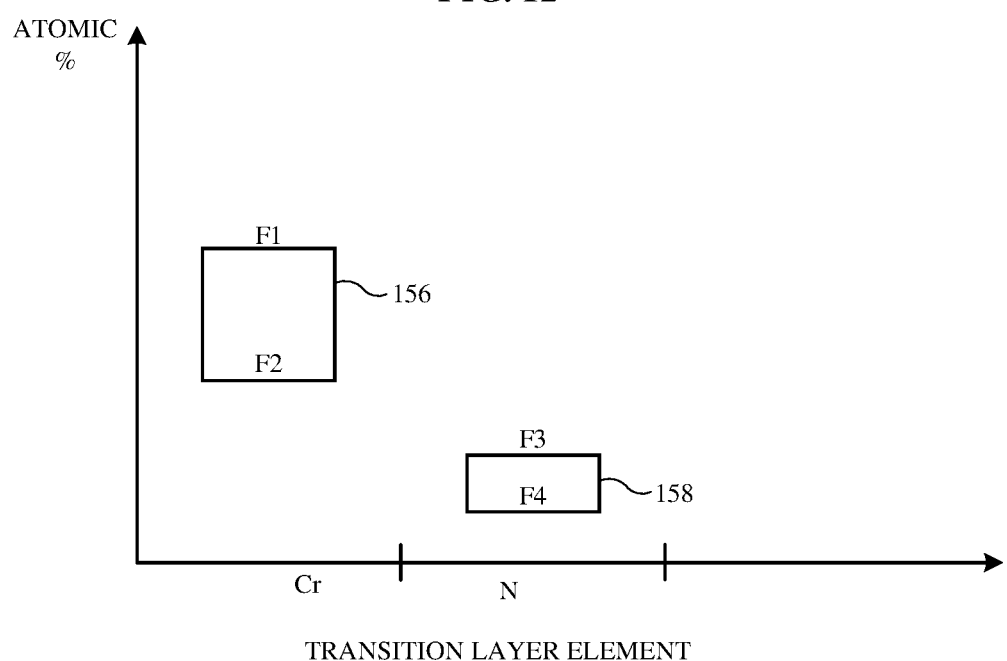
FIG. 13 is a plot of the atomic percentage of different elements in an illustrative transition layer for a coating of the type shown in FIG. 11 in accordance with some embodiments.

FIG. 13 is a plot of illustrative atomic percentages for the different elements in the CrN transition layer 72 of FIG. 11. As shown in FIG. 13, the composition of transition layer 72 may be selected such that the atomic percentage of Cr atoms in layer 72 lies within region 156 (e.g., a region extending between upper limit F1 and lower limit F2). The atomic percentage of N atoms in layer 72 lies within region 158 (e.g., a region extending between upper limit F3 and lower limit F4). In the example of FIG. 13, atomic percentage F1 is greater than atomic percentage F3 and atomic percentage F2 is greater than atomic percentage F4. This is merely illustrative and, in general, these percentages may have other relative magnitudes. Regions 156 and 158 may have other relative positions along the vertical axis of FIG. 13 and may have other relative sizes (e.g., where the size of each region is determined by the difference between its corresponding upper and lower limits).

As an example, the upper limit F1 of region 156 (e.g., the upper limit on the atomic percentage of Cr atoms in layer 72) may be between 90% and 99%, between 85% and 99%, between 92% and 98%, greater than 90%, greater than 85%, less than 96%, less than 99%, or other values. The lower limit F2 of region 156 (e.g., the lower limit on the atomic percentage of Cr atoms in layer 72) may be between 90% and 99%, between 90% and 95%, between 92% and 94%, less than 95%, less than 90%, or other values less than upper limit F1.

The upper limit F3 of region 158 (e.g., the upper limit on the atomic percentage of N atoms in layer 74) may be between 1% and 10%, between 5% and 10%, between 6% and 8%, greater than 5%, greater than 3%, less than 10%, less than 15%, or other values. The lower limit F4 of region 158 (e.g., the lower limit on the atomic percentage of N atoms in layer 72) may be between 1% and 10%, between 4% and 6%, between 2% and 7%, between 1% and 8%, less than 10%, less than 15%, greater than 3%, greater than 1%, or other values less than upper limit F3. These examples are merely illustrative and, in general, other atomic percentages of these elements may be used (e.g., regions 156 and 158 may have other heights, relative positions, and/or relative sizes).

When configured in this way, coating 68 of FIG. 11 may exhibit a desired color. As an example, coating 68 of FIG. 11 may have an L* value between 70 and 80, between 75 and 80, between 60 and 85, between 76 and 78, between 55 and 85, or other L* values in the CIELAB color space. Coating 68 of FIG. 11 may, for example, have an a* value between 0 and 10, between 0 and 5, between 0 and 1, between 0.5 and 1, between 0 and 3, or other a* values in the CIELAB color space. Coating 68 of FIG. 11 may, for example, have a b* value between 10 and 15, between 13 and 15, between 11 and 16, between 5 and 15, or other b* values in the CIELAB color space. In another implementation, color layer 140 may be a titanium chromium nitride (TiCrN) layer and/or may be an intrinsically colored layer rather than a single-layer thin film interference filter.

The examples of FIGS. 4-13 are merely illustrative. In another suitable arrangement, single-layer interference film 76 may be a CrSiN layer (film) whereas neutral-color base layer 74 is also a CrSiN layer (film) (e.g., with different atomic composition ratios between layers 76 and 74). In another suitable arrangement, single-layer interference film 76 may be a CrSiN layer whereas neutral-color base layer 74 is a CrSiC layer. In another suitable arrangement, single-layer interference film 76 may be a CrSiC layer whereas neutral-color base layer 74 is also a CrSiC layer (e.g., with different atomic composition ratios between layers 76 and 74). In another suitable arrangement, single-layer interference film 76 may be a CrSiCN layer whereas neutral-color base layer 74 is a CrSiC layer. In another suitable arrangement, single-layer interference film 76 may be a CrSiN layer whereas neutral-color base layer 74 is a CrSiCN layer. In another suitable arrangement, single-layer interference film 76 may be a CrSiC layer whereas neutral-color base layer 74 is a CrSiCN layer. In yet another suitable arrangement, single-layer interference film 76 may be a CrSiCN layer whereas neutral-color base layer 74 is also a CrSiCN layer (e.g., with different atomic composition ratios between layers 76 and 74). These examples are also merely illustrative. If desired, the Cr atoms in any of these layers may be replaced by Ti or zirconium (Zr) atoms. For example, in another suitable arrangement, single-layer interference film 76 may be a TiSiN layer (film) or a ZrSiN layer whereas neutral-color base layer 74 is also a TiSiN layer (film) or a ZrSiN (e.g., with different atomic composition ratios between layers 76 and 74). In another suitable arrangement, single-layer interference film 76 may be a TiSiN layer or a ZrSiN layer whereas neutral-color base layer 74 is a TiSiC or a ZrSiC layer. In another suitable arrangement, single-layer interference film 76 may be a TiSiC layer or a ZrSiC layer whereas neutral-color base layer 74 is also a TiSiC layer or a ZrSiC (e.g., with different atomic composition ratios between layers 76 and 74). In another suitable arrangement, single-layer interference film 76 may be a TiSiCN layer or a ZrSiCN layer whereas neutral-color base layer 74 is a TiSiC layer or a ZrSiC layer. In another suitable arrangement, single-layer interference film 76 may be a TiSiN layer or a ZrSiN layer whereas neutral-color base layer 74 is a TiSiCN layer or a ZrSiCN layer. In another suitable arrangement, single-layer interference film 76 may be a TiSiC layer or a ZrSiC layer whereas neutral-color base layer 74 is a TiSiCN layer or a ZrSiCN layer. In yet another suitable arrangement, single-layer interference film 76 may be a TiSiCN layer or a ZrSiCN layer whereas neutral-color base layer 74 is also a TiSiCN layer or a ZrSiCN layer (e.g., with different atomic composition ratios between layers 76 and 74). Any combination of these arrangements for layers 74 and 76 may be used if desired.

Coating 68 may exhibit minimal variation in reflected color even as the overall thickness H varies (e.g., due manufacturing tolerances associated with the deposition of coating 68 on substrate 34). In other words, even if the deposition equipment used to deposit coating 68 on substrate 34 exhibits a variation in thickness H of up to 10% across the area of the coating on substrate 34, the color reflected by coating 68 may change by an amount dE that is less than a threshold value over the range of wavelengths that provide the coating with the desired color. In this way, even if coating 68 has different thicknesses across substrate 34 (e.g., in scenarios where substrate 34 is a three-dimensional substrate and/or where the deposition equipment used to deposit the coating is incapable of providing the coating with a precise thickness), coating 68 may still provide substrate 34 with a desired visible color across the entire area of the substrate. This may allow substrate 34 to exhibit an attractive uniform color that maximizes the aesthetic appearance of substrate 34.

The foregoing is merely illustrative and various modifications can be made to the described embodiments. The foregoing embodiments may be implemented individually or in any combination.

What is claimed is:

1. Apparatus comprising:
   a conductive substrate; and
   a coating on the conductive substrate and having a color, the coating comprising:
      adhesion and transition layers,
      a CrSiN layer on the adhesion and transition layers, the CrSiN layer being opaque to light of the color, and
      an uppermost layer on the CrSiN layer, the uppermost layer comprising a CrSiC film.

2. The apparatus of claim 1, wherein the CrSiC film forms a single-layer interference filter.

3. The apparatus of claim 1, wherein the CrSiC film has a thickness between 0.01 and 0.1 microns.

4. The apparatus of claim 3, wherein an atomic percentage of Cr atoms in the CrSiC film is greater than 25% and less than 35% and wherein an atomic percentage of Si atoms in the CrSiC film is greater than 50% and less than 60%.

5. The apparatus of claim 4, wherein an atomic percentage of Cr atoms in the CrSiN layer is greater than 55% and less than 65% and wherein an atomic percentage of Si atoms in the CrSiN layer is greater than 20% and less than 30%.

6. The apparatus of claim 5, wherein the CrSiC film has a thickness between 0.04 and 0.06 microns.

7. The apparatus of claim 6, wherein the coating has an L* value between 45 and 55 in a CIELAB color space, an a* value between −5 and 0 in the CIELAB color space, and a b* value between −14 and −10 in the CIELAB color space.

8. The apparatus of claim 3, wherein an atomic percentage of Cr atoms in the CrSiC film is greater than 50% and less than 60% and wherein an atomic percentage of Si atoms in the CrSiC film is greater than 30% and less than 40%.

9. The apparatus of claim 8, wherein an atomic percentage of Cr atoms in the CrSiN layer is greater than 60% and less than 70% and wherein an atomic percentage of Si atoms in the CrSiN layer is greater than 10% and less than 25%.

10. The apparatus of claim 9, wherein the CrSiC film has a thickness between 0.01 and 0.04 microns.

11. The apparatus of claim 10, wherein the coating has an L* value between 35 and 40 in a CIELAB color space, an a* value between 0 and 5 in the CIELAB color space, and a b* value between −10 and −5 in the CIELAB color space.

12. The apparatus defined in claim 1,
wherein the adhesion and transition layers comprise a seed layer on the conductive substrate and a transition layer on the seed layer, wherein the seed layer comprises a material selected from the group consisting of: Cr, CrSi, and Ti, and wherein the transition layer comprises a material selected from the group consisting of: CrSiN, CrSiCN, CrN, and CrCN.

13. The apparatus defined in claim 1, wherein the conductive substrate comprises a conductive substrate selected from the group consisting of: a conductive electronic device housing wall and a three-dimensional conductive structure for an electronic device.

14. Apparatus comprising:
a conductive substrate; and
a coating on the conductive substrate and having a color, the coating comprising:
adhesion and transition layers,
a CrSiN layer on the adhesion and transition layers, the CrSiN layer being opaque to light of the color, and
an uppermost layer on the CrSiN layer, the uppermost layer comprising a CrSiCN film, wherein the CrSiCN film has a thickness between 0.01 and 0.1 microns.

15. The apparatus of claim 14, wherein the CrSiCN film forms a single-layer interference filter.

16. The apparatus of claim 15, wherein an atomic percentage of Cr atoms in the CrSiCN film is greater than 30%, wherein an atomic percentage of Si atoms in the CrSiCN film is greater than 20%, and wherein an atomic percentage of C atoms in the CrSiCN film is greater than 30%.

17. The apparatus of claim 16, wherein the atomic percentage of Cr atoms in the CrSiCN film is less than 36% and wherein the atomic percentage of Si atoms in the CrSiCN film is less than 30%.

18. The apparatus of claim 17, wherein an atomic percentage of Cr atoms in the CrSiN layer is greater than 30% and less than 40% and wherein an atomic percentage of Si atoms in the CrSiN layer is greater than 10% and less than 20%.

19. The apparatus of claim 18, wherein the thickness is between 0.05 and 0.07 microns.

20. The apparatus of claim 19, wherein the coating has an L* value between 45 and 50 in a CIELAB color space, an a* value between −5 and −2 in the CIELAB color space, and a b* value between −12 and −8 in the CIELAB color space.

21. Apparatus comprising:
a conductive substrate; and
a coating on the conductive substrate and having a color, the coating comprising:
a Cr seed layer,
a CrN transition layer on the Cr seed layer, and
an uppermost layer on the CrN transition layer, wherein the uppermost layer comprises TiSiN.

22. The apparatus of claim 21, wherein the uppermost layer has a thickness between 0.3 and 0.5 microns and wherein an atomic percentage of Ti atoms in the uppermost layer is greater than 50% and less than 60%.

23. The apparatus of claim 22, wherein the coating has an L* value between 70 and 80 in a CIELAB color space, an a* value between 0 and 5 in the CIELAB color space, and a b* value between 10 and 15 in the CIELAB color space.

24. Apparatus comprising:
a conductive substrate; and
a coating on the conductive substrate and having a color, the coating comprising:
adhesion and transition layers,
a CrSiCN layer on the adhesion and transition layers, the CrSiCN layer being opaque to light of the color, and
an uppermost layer on the CrSiCN layer, the uppermost layer comprising a CrSiCN film.

* * * * *